(12) United States Patent
Ogata et al.

(10) Patent No.: US 8,881,751 B2
(45) Date of Patent: Nov. 11, 2014

(54) SUBSTRATE LIQUID PROCESSING APPARATUS, METHOD OF CONTROLLING SUBSTRATE LIQUID PROCESSING APPARATUS, AND STORAGE MEDIUM PERFORMING SUBSTRATE LIQUID PROCESSING APPARATUS CONTROL METHOD ON SUBSTRATE LIQUID PROCESSING APPARATUS

(75) Inventors: Nobuhiro Ogata, Koshi (JP); Shuichi Nagamine, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 539 days.

(21) Appl. No.: 13/151,577

(22) Filed: Jun. 2, 2011

(65) Prior Publication Data
US 2011/0297257 A1    Dec. 8, 2011

(30) Foreign Application Priority Data
Jun. 3, 2010  (JP) ................. 2010-128160

(51) Int. Cl.
*H01L 21/67*    (2006.01)
(52) U.S. Cl.
CPC .................... *H01L 21/67051* (2013.01)
USPC .............. 134/183; 134/84; 134/153; 134/182
(58) Field of Classification Search
CPC ................................................ H01L 21/67051
USPC .............. 134/153, 84, 85, 88, 121, 182, 183; 396/611
See application file for complete search history.

(56) References Cited

U.S. PATENT DOCUMENTS

| | | | | |
|---|---|---|---|---|
| 5,871,584 | A | * | 2/1999 | Tateyama et al. ............. 118/323 |
| 2002/0053319 | A1 | * | 5/2002 | Nagamine ......................... 118/52 |
| 2004/0226582 | A1 | * | 11/2004 | Satoshi et al. ............... 134/25.4 |
| 2006/0048792 | A1 | * | 3/2006 | Nakamura et al. ................ 134/2 |
| 2006/0222315 | A1 | | 10/2006 | Yoshida |
| 2007/0163711 | A1 | | 7/2007 | Koo et al. |

FOREIGN PATENT DOCUMENTS

| | | |
|---|---|---|
| JP | 10-323633 A1 | 12/1998 |
| JP | 2000-183010 | 6/2000 |
| JP | 2000-260743 A | 9/2000 |

(Continued)

OTHER PUBLICATIONS

Japanese Office Action from a corresponding Japanese patent application bearing a mailing date of Sep. 28, 2012.

(Continued)

*Primary Examiner* — Michael Kornakov
*Assistant Examiner* — Marc Lorenzi
(74) *Attorney, Agent, or Firm* — Burr & Brown, PLLC

(57) ABSTRACT

A substrate liquid processing apparatus includes a placement table configured to hold a substrate, a rotary driving unit configured to rotate the placement table, a liquid supply unit configured to supply a liquid to the substrate placed on the placement table, and an upper liquid guide cup, a central liquid guide cup, and a lower liquid guide cup which are disposed in this order from the top and are configured to guide downward the liquid scattering from the rotating substrate being placed on the placement table. A driving mechanism is configured to move up and down the upper liquid guide cup, the central liquid guide cup, and the lower liquid guide cup. The driving mechanism is connected to the central liquid guide cup.

11 Claims, 5 Drawing Sheets

(56) References Cited

FOREIGN PATENT DOCUMENTS

| JP | 2001-267278 | A | 9/2001 |
|----|-------------|-----|---------|
| JP | 2004-158482 | A1 | 6/2004 |
| JP | 2006-286832 | A1 | 10/2006 |
| JP | 2007-189232 | A1 | 7/2007 |
| JP | 2008-180775 | A | 5/2008 |

OTHER PUBLICATIONS

U.S. Appl. No. 13/151,610, filed Jun. 2, 2011, Ogata et al.
U.S. Appl. No. 13/151,665, filed Jun. 2, 2011, Ogata et al.

* cited by examiner

SUBSTRATE LIQUID PROCESSING APPARATUS, METHOD OF CONTROLLING SUBSTRATE LIQUID PROCESSING APPARATUS, AND STORAGE MEDIUM PERFORMING SUBSTRATE LIQUID PROCESSING APPARATUS CONTROL METHOD ON SUBSTRATE LIQUID PROCESSING APPARATUS

CROSS REFERENCE TO RELATED APPLICATIONS

This application is based upon and claims the benefit of priority from the prior Japanese Patent Application No. 2010-128160, filed on Jun. 3, 2010; the entire contents of which are incorporated herein by reference.

FIELD OF THE INVENTION

The present invention relates to a substrate liquid processing apparatus for processing an object to be processed with a liquid, a method of controlling the substrate liquid processing apparatus, and a storage medium performing the substrate liquid processing apparatus control method on the substrate liquid processing apparatus.

BACKGROUND ART

In the process of manufacturing semiconductor products or flat-panel displays (FPDs), a liquid process has been frequently used which supplies a process-liquid to a semiconductor wafer or a glass substrate as a substrate to be processed. Examples of such a process include a cleaning process of removing particles or contaminants adhering to the substrate and the like.

As a liquid processing apparatus performing the liquid process, there have been known a plurality of single-wafer-type processing units, each of which holds a substrate such as a semiconductor wafer with a spinning chuck and performs a process on the substrate by supplying a process-liquid to the front or rear surface of the rotating substrate.

The process-liquid supplied to the substrate throws off from the rotating substrate and is changed into mist scattering around a substrate placement table. As a mechanism recovering the mist, Japanese Patent Application Laid-Open (JP-A) No. 2000-183010 discloses a chemical liquid recovery cup and a rinse liquid recovery cup.

As shown in FIG. 7, the existing mechanism has a configuration in which a chemical liquid recovery cup 115 and a rinse liquid recovery cup 116 are segmented by an intermediate cup wall 130 and the intermediate cup wall 130 is configured to be able to be moved up and down by an air cylinder 132.

When the air cylinder 132 contracts so that the intermediate cup wall 130 is located at the down position (the state of FIG. 7), an opening 115a of the chemical liquid recovery cup 115 increases in size so that it faces a peripheral edge of a substrate W on a spinning chuck 111. In this state, a chemical liquid process is performed, and the chemical liquid (and mist thereof) throwing off from the substrate W is recovered in the chemical liquid recovery cup 115.

On the other hand, when the air cylinder 132 expands so that the intermediate cup wall 130 is located at the up position, an opening 116a of the rinse liquid recovery cup 116 increases in size so that it faces the peripheral edge of the substrate W on the spinning chuck 111. In this state, a rinse liquid process is performed, and the rinse liquid (and mist thereof) throwing off from the substrate W is recovered in the rinse liquid recovery cup 116.

SUMMARY OF THE INVENTION

However, the mist recovery mechanism described by referring to FIG. 7 can separately recover two types of mists but it is virtually impossible to realize a configuration that can recover three or more types of mists separately based on the mist recovery mechanism.

The present invention is made in view of such circumstances, and an object thereof is to provide a substrate liquid processing apparatus capable of separately recovering three types or more of mists, a method of controlling the substrate liquid processing apparatus, and a storage medium performing the substrate liquid processing apparatus control method on the substrate liquid processing apparatus.

The present invention provides a substrate liquid processing apparatus including: a placement table configured to hold a substrate; a rotary driving unit configured to rotate the placement table; a liquid supply unit configured to supply a liquid to the substrate placed on the placement table; an upper liquid guide cup, a central liquid guide cup, and a lower liquid guide cup which are disposed in this order from the top and are configured to guide downward the liquid scattering from the rotating substrate being placed on the placement table; and a driving mechanism configured to move up and down the upper liquid guide cup, the central liquid guide cup, and the lower liquid guide cup, wherein the driving mechanism is connected to the central liquid guide cup.

According to the present invention, the liquid scattering from the substrate can be guided to the corresponding cup by appropriately moving up and down the upper liquid guide cup, the central liquid guide cup, and the lower liquid guide cup in accordance with the type of the liquid supplied to the substrate. Accordingly, three or more types of mists can be separately recovered with high efficiency.

The present invention provides a method of controlling a substrate liquid processing apparatus including: a placement table configured to hold a substrate; a rotary driving unit configured to rotate the placement table; a liquid supply unit configured to supply a liquid to the substrate placed on the placement table; an upper liquid guide cup, a central liquid guide cup, and a lower liquid guide cup which are disposed in this order from the top and are configured to guide downward the liquid scattering from the rotating substrate being placed on the placement table; and a driving mechanism configured to move up and down the upper liquid guide cup, the central liquid guide cup, and the lower liquid guide cup, the method comprising: moving upward the central liquid guide cup independently of the upper liquid guide cup and the lower liquid guide cup in a partial range of an upward movement range, while the driving mechanism moves upward the central liquid guide cup; and moving upward the central liquid guide cup together with the upper liquid guide cup supported by the central liquid guide cup in another partial range of the upward movement range, while the driving mechanism moves upward the central liquid guide cup.

The present invention provides a storage medium storing a program executed by a control unit controlling a substrate liquid processing apparatus, thereby performing a control method of the substrate liquid processing apparatus on the substrate liquid processing apparatus when the program is executed by the control unit, the substrate liquid processing apparatus including: a placement table configured to hold a substrate; a rotary driving unit configured to rotate the placement table; a liquid supply unit configured to supply a liquid to the substrate placed on the placement table; an upper liquid guide cup, a central liquid guide cup, and a lower liquid guide cup which are disposed in this order from the top and are configured to guide downward the liquid scattering from the rotating substrate being placed on the placement table; and a driving mechanism configured to move up and down the upper liquid guide cup, the central liquid guide cup, and the lower liquid guide cup, the method comprising: moving upward the central liquid guide cup independently of the upper liquid guide cup and the lower liquid guide cup in a partial range of an upward movement range, while the driving mechanism moves upward the central liquid guide cup; and moving upward the central liquid guide cup together with the upper liquid guide cup supported by the central liquid guide cup in another partial range of the upward movement range, while the driving mechanism moves upward the central liquid guide cup.

DETAILED DESCRIPTION OF THE INVENTION

Figure 1:
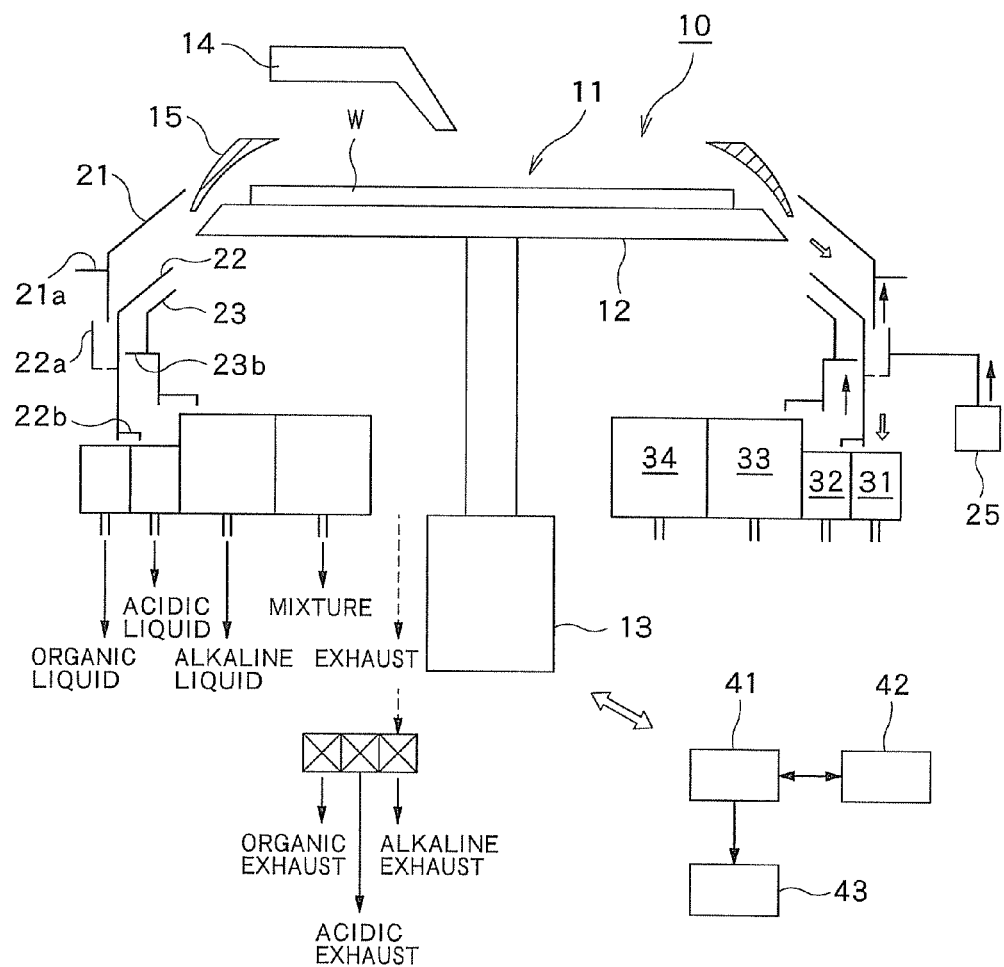
FIG. 1 is a cross-sectional view schematically illustrating the configuration of a liquid processing apparatus in a first recovery state according to an embodiment of the present invention.

Embodiment of a substrate liquid processing apparatus, a method of controlling the substrate liquid processing apparatus, and a storage medium performing the substrate liquid processing apparatus control method on the substrate liquid processing apparatus according to the present invention described above will be described.

In the substrate liquid processing apparatus according to the embodiment of the present invention, it is preferable that an upper liquid guide cup is moved upward in a manner of being supported by a central liquid guide cup. In particular, it is preferable that while a driving mechanism moves upward the central liquid guide cup, the central liquid guide cup moves upward independently of the upper liquid guide cup and a lower liquid guide cup in a partial range of an upward movement range and moves upward together with the upper liquid guide cup supported by the central liquid guide cup in another partial range of the upward movement range.

In addition, in the substrate liquid processing apparatus according to the embodiment of the present invention, it is preferable that the lower liquid guide cup is moved upward in a manner of being supported by the central liquid guide cup. In particular, it is preferable that while the driving mechanism moves upward the central liquid guide cup, the central liquid guide cup moves upward independently of the upper liquid guide cup and the lower liquid guide cup in a partial range of an upward movement range and moves upward together with the lower liquid guide cup supported by the central liquid guide cup in another partial range of the upward movement range.

In addition, in the substrate liquid processing apparatus according to the embodiment of the present invention, it is preferable that each of the upper liquid guide cup and the lower liquid guide cup is individually supported by the central liquid guide cup. In particular, it is preferable that while the driving mechanism moves upward the central liquid guide cup, the central liquid guide cup moves upward independently of the upper liquid guide cup and the lower liquid guide cup in a partial range of an upward movement range and moves upward together with the upper liquid guide cup and the lower liquid guide cup which are individually supported by the central liquid guide cup in another partial range of the upward movement range.

By adopting such a configuration, the central liquid guide cup is moved up and down independently of the upper liquid guide cup and the lower liquid guide cup in a partial range of the upward moving range, the gap between the upper liquid guide cup and the central liquid guide cup and/or the gap between the central liquid guide cup and the lower liquid guide cup is changeable, and the space for the up-down movement of each cup in the vertical direction may be reduced. Further, since the gap between the upper liquid guide cup and the central liquid guide cup and/or the gap between the central liquid guide cup and the lower liquid guide cup is changeable, it is possible to provide a tank which temporarily stores the recovered liquid at the lower area while suppressing an increase in the height of the substrate liquid processing apparatus.

In addition, in the substrate liquid processing apparatus according to the embodiment of the present invention, specifically, for example, it is preferable that the upper liquid guide cup includes an outer flange provided at the outer peripheral wall thereof, the central liquid guide cup includes an outer peripheral contact portion capable of supporting the outer flange of the upper liquid guide cup from the lower side, and when the central liquid guide cup moves upward in the state where the outer peripheral contact portion of the central liquid guide cup supports the outer flange of the upper liquid guide cup from the lower side, the upper liquid guide cup moves upward simultaneously.

In addition, in the substrate liquid processing apparatus according to the embodiment of the present invention, specifically, for example, it is preferable that the lower liquid guide cup includes an outer flange provided at the outer peripheral wall thereof, the central liquid guide cup includes an inner peripheral contact portion capable of supporting the outer flange of the lower liquid guide cup from the lower side, and when the central liquid guide cup moves upward in the state where the inner peripheral contact portion of the central liquid guide cup supports the outer flange of the lower liquid guide cup from the lower side, the lower liquid guide cup moves upward simultaneously.

In addition, in the substrate liquid processing apparatus according to the embodiment of the present invention, specifically, for example, it is preferable that the upper liquid guide cup includes an outer flange provided at the outer peripheral wall thereof, the lower liquid guide cup includes an outer flange provided at the outer peripheral wall thereof, the central liquid guide cup includes an outer peripheral contact portion capable of supporting the outer flange of the upper liquid guide cup from the lower side and an inner peripheral contact portion capable of supporting the outer flange of the lower liquid guide cup from the lower side, and when the central liquid guide cup moves upward in the state where the outer peripheral contact portion of the central liquid guide cup supports the outer flange of the upper liquid guide cup from the lower side and the inner peripheral contact portion of the central liquid guide cup supports the outer flange of the lower liquid guide cup from the lower side, the upper liquid guide cup and the lower liquid guide cup move upward simultaneously.

By adopting such a configuration, the upper liquid guide cup and the lower liquid guide cup may be easily moved up and down by the power of the driving mechanism moving up and down the central liquid guide cup. That is, the driving system may have a simple structure.

In addition, in the substrate liquid processing apparatus according to the embodiment of the present invention, it is preferable that when the liquid scattering from the rotating substrate being placed on a placement table is guided to a gap between the upper liquid guide cup and the central liquid guide cup, a gap between the central liquid guide cup and the lower liquid guide cup is blocked.

In addition, in the substrate liquid processing apparatus according to the embodiment of the present invention, it is preferable that when the liquid scattering from the rotating substrate being placed on the placement table is guided to a gap between the central liquid guide cup and the lower liquid guide cup, a gap between the upper liquid guide cup and the central liquid guide cup is blocked.

The method of controlling the substrate liquid processing apparatus according to the embodiment of the present invention preferably further comprises moving upward the central liquid guide cup together with the upper liquid guide cup and the lower liquid guide cup which are individually supported by the central liquid guide cup respectively in another partial range of the upward movement range, while the driving mechanism moves upward the central liquid guide cup.

Hereinafter, an embodiment of the present invention will be described by referring to the accompanying drawings in detail. The present invention may be typically applied to a process of cleaning a semiconductor wafer (an example of an object to be processed) and particularly, a process using a chemical liquid (referred to a chemical liquid process).

As shown in FIG. 1, a liquid processing apparatus 10 is a single-wafer-type substrate liquid processing apparatus that includes a substrate processing chamber 11 in which a substrate is loaded and unloaded one by one and is processed. The substrate process chamber 11 is provided with, for example, a placement table 12 on which a substrate such as a semiconductor wafer is placed. The placement table 12 is configured to rotate within a horizontal plane by a rotary motor (which is an example of a rotary driving unit) 13.

Further, the substrate process chamber 11 is provided with a nozzle (which is an example of a liquid supply unit) 14 that supplies various process-liquids onto the upper surface of the substrate. The nozzle 14 is configured to be selectively connected to, for example, a supply source (not shown) for various process-liquids. Then, a mist guide cup 15 is provided around the placement table 12 to guide the scattering process-liquid or mist thereof. Although the mist guide cup 15 is a substantially annular member where the lower opening end is larger in diameter than the upper opening end and the vertical cross-section has an upward convex curve.

An upper liquid guide cup 21, a central liquid guide cup 22, and a lower liquid guide cup 23 are disposed in this order from the top around the mist guide cup 15 to guide the process-liquid guided by the mist guide cup 15 downward.

In the embodiment, the upper liquid guide cup 21 is provided so that the edge thereof (the inner peripheral edge) near the mist guide cup 15 is located above the peripheral edge area of the mist guide cup 15. The upper liquid guide cup 21 schematically includes a sloped portion having a truncated cone shape and a vertical portion extending downward from the outer peripheral end of the sloped portion.

Further, the central liquid guide cup 22 is provided so that the edge thereof near the mist guide cup 15 is movable in the vertical direction with respect to the peripheral edge area of the mist guide cup 15, in a range from the upper side to the lower side thereof. An up-down movement cylinder 25 is connected to the central liquid guide cup 22 to move up and down the central liquid guide cup (above all, a driving mechanism that moves up and down the central liquid guide cup 22 is not limited to the up-down movement cylinder 25, but may be a driving mechanism such as a motor). The central liquid guide cup 22 also schematically includes a sloped portion having a truncated cone shape and a vertical portion extending downward from the outer peripheral end of the sloped portion.

Then, furthermore, the lower liquid guide cup 23 is provided so that the edge thereof near the mist guide cup 15 is movable in the vertical direction with respect to the peripheral edge area of the mist guide cup 15 in a range from the upper side to the lower side thereof. The lower liquid guide cup 23 also schematically includes a sloped portion having a truncated cone shape and a vertical portion extending downward from the outer peripheral end of the sloped portion.

Figure 2:
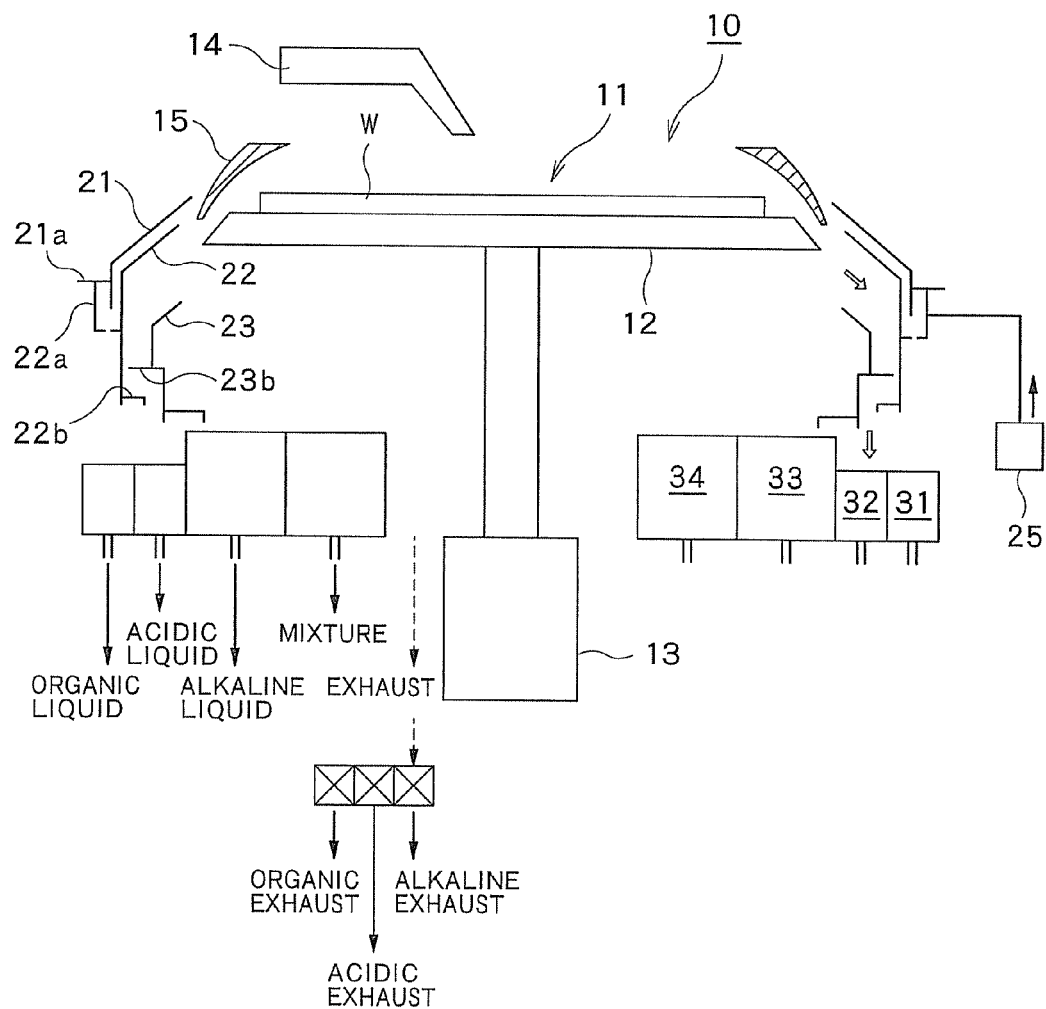
FIG. 2 is a cross-sectional view schematically illustrating the configuration of the liquid processing apparatus in a second recovery state according to the embodiment of the present invention.
Figure 3:
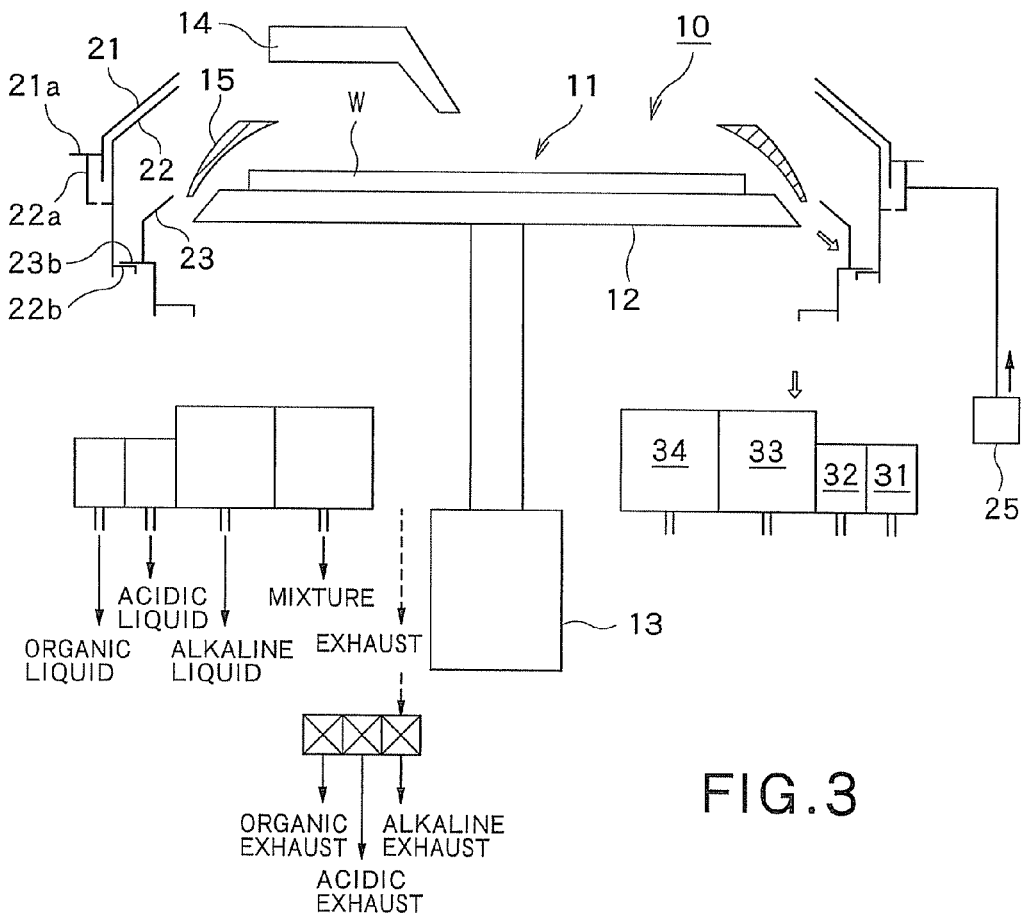
FIG. 3 is a cross-sectional view schematically illustrating the configuration of the liquid processing apparatus in a third recovery state according to the embodiment of the present invention.

The central liquid guide cup 22 in the state of FIG. 1 is positioned at the lowest position among three states of FIGS. 1 to 3 by the up-down movement cylinder 25. This state corresponds to a state of FIG. 4 to be specifically described later. In this state, the upper liquid guide cup 21 is supported by a support protrusion 29s (refer to FIG. 4) provided in the substrate process chamber 11 from the underside thereof, that is, the upper liquid guide cup 21 is not supported by the central liquid guide cup 22. Further, the lower liquid guide cup 23 is also supported by a support protrusion 28s formed in a member 28 fixed to the substrate process chamber 11, that is, the lower liquid guide cup 23 is not supported by the central liquid guide cup 22.

In the embodiment, the upper liquid guide cup 21 is also movable in the vertical direction. Specifically, the upper liquid guide cup 21 includes an outer flange 21a which is provided at the outer peripheral wall thereof, and the central liquid guide cup 22 includes an outer peripheral contact portion 22a which may support the outer flange 21a of the upper liquid guide cup 21 from the lower side thereof. When the central liquid guide cup 22 is moved in the vertical direction by the up-down movement cylinder 25 in the state where the outer peripheral contact portion 22a of the central liquid guide cup 22 supports the outer flange 21a of the upper liquid guide cup 21 from the lower side thereof, the upper liquid guide cup 21 is also moved in the vertical direction.

That is, the central liquid guide cup 22 moves in the vertical direction independently of the upper liquid guide cup 21 in a partial range of a vertical movement range, and moves in the vertical direction together with the upper liquid guide cup 21 in another partial range.

By adopting such a configuration, the upper liquid guide cup 21 may be also moved up and down by the power of the up-down movement cylinder 25 that moves up and down the central liquid guide cup 22. That is, the driving system has a simple structure.

Above all, the embodiment of employing the contact between the outer flange 21a and the outer peripheral contact portion 22a is merely an example. The upper liquid guide cup 21 and the central liquid guide cup 22 may all be moved in the vertical direction by an arbitrary portion of the upper liquid guide cup 21 and an arbitrary portion of the central liquid guide cup 22.

Further, the lower liquid guide cup 23 includes an outer flange 23b which is provided at the outer peripheral wall thereof, and the central liquid guide cup 22 includes an inner peripheral contact portion 22b which supports the outer flange 23b of the lower liquid guide cup 23 from the lower side thereof. When the central liquid guide cup 22 is moved in the vertical direction by the up-down movement cylinder 25 in the state where the inner peripheral contact portion 22b of the central liquid guide cup 22 supports the outer flange 23b of the lower liquid guide cup 23 from the lower side thereof, the lower liquid guide cup 23 is also moved in the vertical direction.

That is, the central liquid guide cup 22 moves in the vertical direction independently of the lower liquid guide cup 23 in a partial range the vertical movement range, and moves in the vertical direction together with the lower liquid guide cup 23 in another partial range.

By adopting such a configuration, the lower liquid guide cup 23 may be also moved up and down by the power of the up-down movement cylinder 25 that moves up and down the central liquid guide cup 22. That is, the driving system has a simple structure.

Above all, the embodiment of employing the contact between the outer flange 23b and the inner peripheral contact portion 22b is merely an example. The lower liquid guide cup 23 and the central liquid guide cup 22 may all be moved in the vertical direction by using an arbitrary portion of the lower liquid guide cup 23 and an arbitrary portion of the central liquid guide cup 22.

That is, in the embodiment, the central liquid guide cup 22 is moved up and down independently of the upper liquid guide cup 21 and the lower liquid guide cup 23 in a first partial range of the up-down movement range of the central liquid guide cup 22. The central liquid guide cup 22 is moved up and down together with the upper liquid guide cup 21 in a second partial range, and is moved up and down together with the upper liquid guide cup 21 and the lower liquid guide cup 23 in a third partial range.

When a first recovery state (FIG. 1) to be described later changes to a second recovery state (FIG. 2), first, the central liquid guide cup 22 is moved upward by the up-down movement cylinder 25 independently of the upper liquid guide cup 21 and the lower liquid guide cup 23 (a first partial range of the upward movement range). Subsequently, the outer peripheral contact portion 22a of the central liquid guide cup 22 supports the underside of the outer flange 21a of the upper liquid guide cup 21, and the central liquid guide cup 22 moves upward together with the upper liquid guide cup 21 (a second partial range), so that it reaches the state shown in FIG. 2.

Further, when the second recovery state (FIG. 2) changes to a third recovery state (FIG. 3), first, the central liquid guide cup 22 is moved upward by the up-down movement cylinder 25 together with the upper liquid guide cup 21 (the second range). Subsequently, the inner peripheral contact portion 22b of the central liquid guide cup 22 supports the outer flange 23b of the lower liquid guide cup 23 from the lower side thereof, and the central liquid guide cup 22 moves upward together with the upper liquid guide cup 21 and the lower liquid guide cup 23 (the third range), so that it reaches the state shown in FIG. 3.

When the third recovery state changes to the first recovery state, the liquid processing apparatus may be returned to the state shown in FIG. 1 via the third range, the second range, and the first range described above by moving the central liquid guide cup 22 downward.

Figure 5:
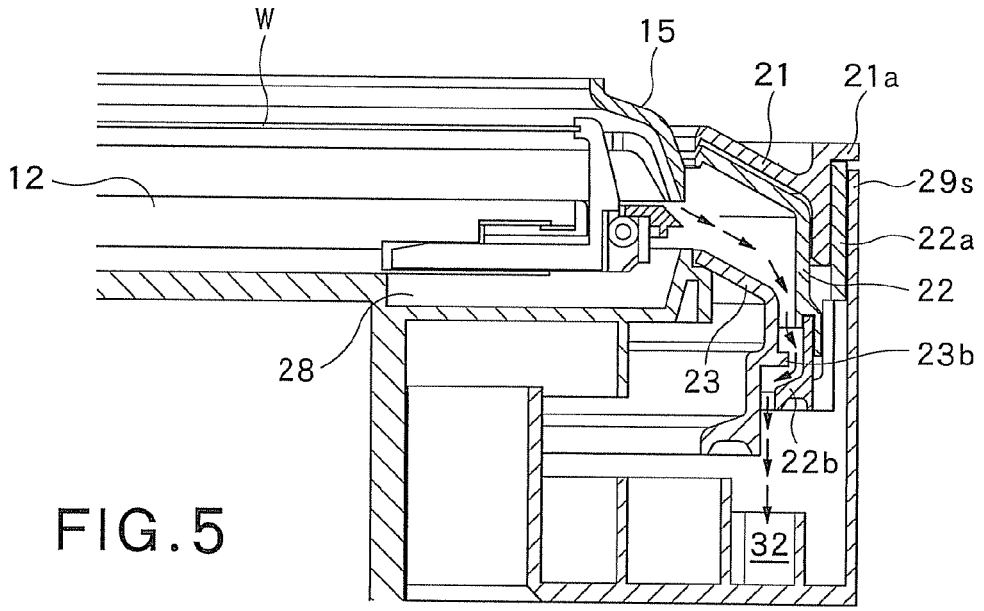
FIG. 5 is a cross-sectional view specifically illustrating the second recovery state corresponding to FIG. 2.

Furthermore, the inner peripheral contact portion 22b also serves as a shelf portion to guide a liquid. As shown in FIG. 5, the shelf portion 22b has a sloped surface (a tapered surface) where the inner periphery is relatively low.

Figure 4:
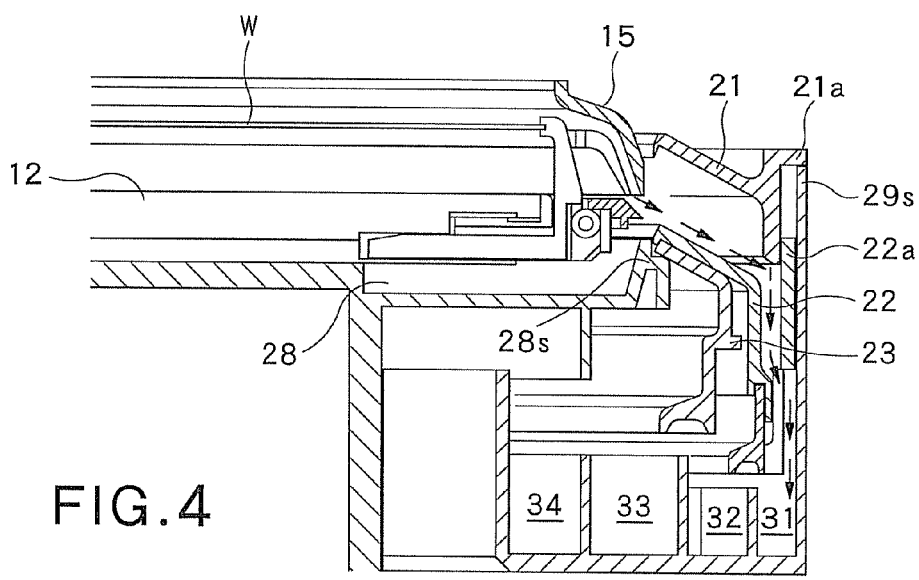
FIG. 4 is a cross-sectional view specifically illustrating the first recovery state corresponding to FIG. 1.

Further, a shelf portion to guide a liquid is also provided at the bottom portion of the lower liquid guide cup 23. As shown in FIG. 4, the shelf portion is also formed as a sloped surface (tapered surface) where the inner periphery thereof is relatively low.

In the configuration described above, the vertical position of the upper liquid guide cup 21, the vertical position of the central liquid guide cup 22, and the vertical position of the lower liquid guide cup 23 are controlled by a control unit 41 to realize the following three recovery states. That is, the control unit 41 is connected to the rotary motor 13 and the up-down movement cylinder 25, and the rotary motor 13 and the up-down movement cylinder 25 are controlled by the control unit 41. Further, the control unit 41 may be configured to select each process-liquid to be supplied to the substrate via the nozzle 14. That is, an acidic liquid, an alkaline liquid and, and an organic liquid are selectively supplied from the nozzle 14 by the control unit 41.

Incidentally, as shown in FIG. 1, the control unit 41 is connected with an input-output unit 42 including a keyboard used to enter a command, or a display used to visually display the operation state of the liquid processing apparatus 10 in order for a process manager or the like to manage the liquid processing apparatus 10. Further, the control unit 41 is configured to be able to access a storage medium 43 storing a program or the like for realizing a process performed in the liquid processing apparatus 10. The storage medium 43 may be configured as a known storage medium, that is, a memory such as a ROM and a RAM, a hard disc, a CD-ROM, a DVD-ROM, and a disc-like storage medium such as a flexible disc. In this manner, the liquid processing apparatus 10 performs a process on the wafer W in a manner such that the control unit 41 executes the program or the like stored in advance on the storage medium 43.

That is, the control unit 41 controls the liquid processing apparatus 10 to realize a first recovery state (FIG. 1) where the edge of the central liquid guide cup 22 that is near the mist guide cup 15 and the edge of the lower liquid guide cup 23 that is near the mist guide cup 15 are located below the peripheral edge area of the mist guide cup 15 so as to recover a liquid via the gap between the upper liquid guide cup 21 and the central liquid guide cup 22, the second recovery state (FIG. 2) where the edge of the central liquid guide cup 22 that is near the mist guide cup 15 is located above the peripheral edge area of the mist guide cup 15 and the edge of the lower liquid guide cup 23 that is near the mist guide cup 15 is located below the peripheral edge area of the mist guide cup 15 so as to recover a liquid via the gap between the central liquid guide cup 22 and the lower liquid guide cup 23, and the third recovery state (FIG. 3) where the edge of the central liquid guide cup 22 that is near the mist guide cup 15 and the edge of the lower liquid guide cup 23 that is near the mist guide cup 15 are located above the peripheral edge area of the mist guide cup 15 so as to recover a liquid via the lower side of the lower liquid guide cup 23.

Then, the liquid recovered in the first recovery state is guided to a first drain tank 31 that is provided at the outer peripheral areas of the lower area of the upper liquid guide cup 21, the central liquid guide cup 22, and the lower liquid guide cup 23 (FIG. 1).

Further, the liquid recovered in the third recovery state is guided to a third drain tank 33 that is provided at the inner peripheral area of the lower area of the upper liquid guide cup 21, the central liquid guide cup 22, and the lower liquid guide cup 23 (FIG. 3).

Then, the liquid recovered in the second recovery state is guided to a second drain tank 32 provided between the first drain tank 31 and the third drain tank 33 in the radial direction (FIG. 2).

As shown in FIGS. 1 to 3, the first drain tank 31, the second drain tank 32, and the third drain tank 33 are arranged in series in the radial direction.

In the embodiment, a fourth drain tank 34 is further provided within the range of the inner diameter of the third drain tank 33. Then, the space inside the inner diameter of the fourth drain tank 34 serves as a gas path through which gas is released.

Figure 6:
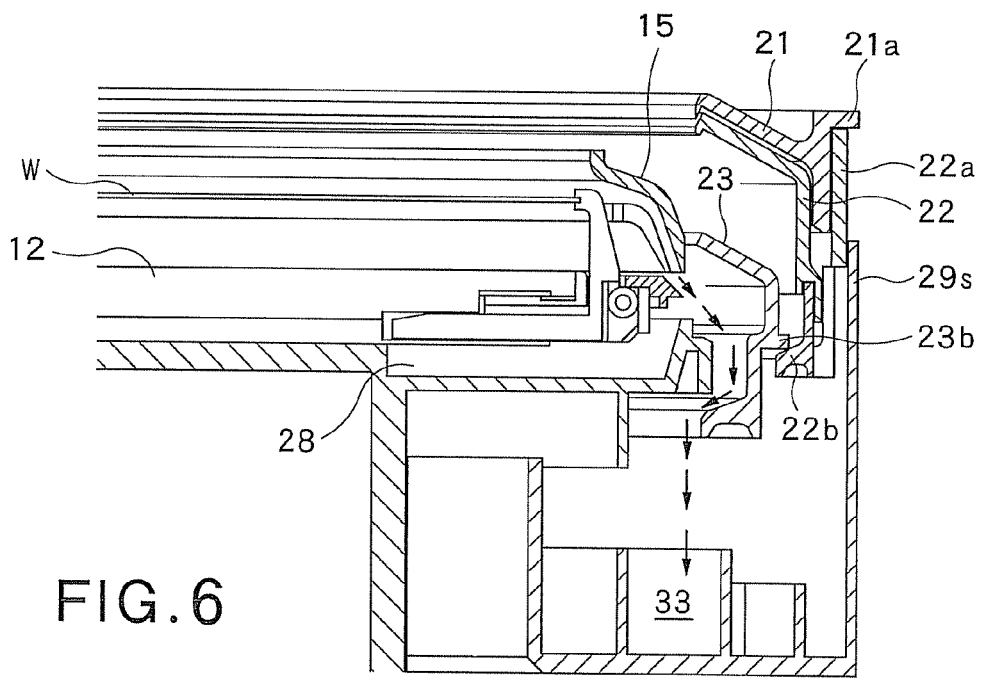
FIG. 6 is a cross-sectional view specifically illustrating the third recovery state corresponding to FIG. 3.
Figure 7:
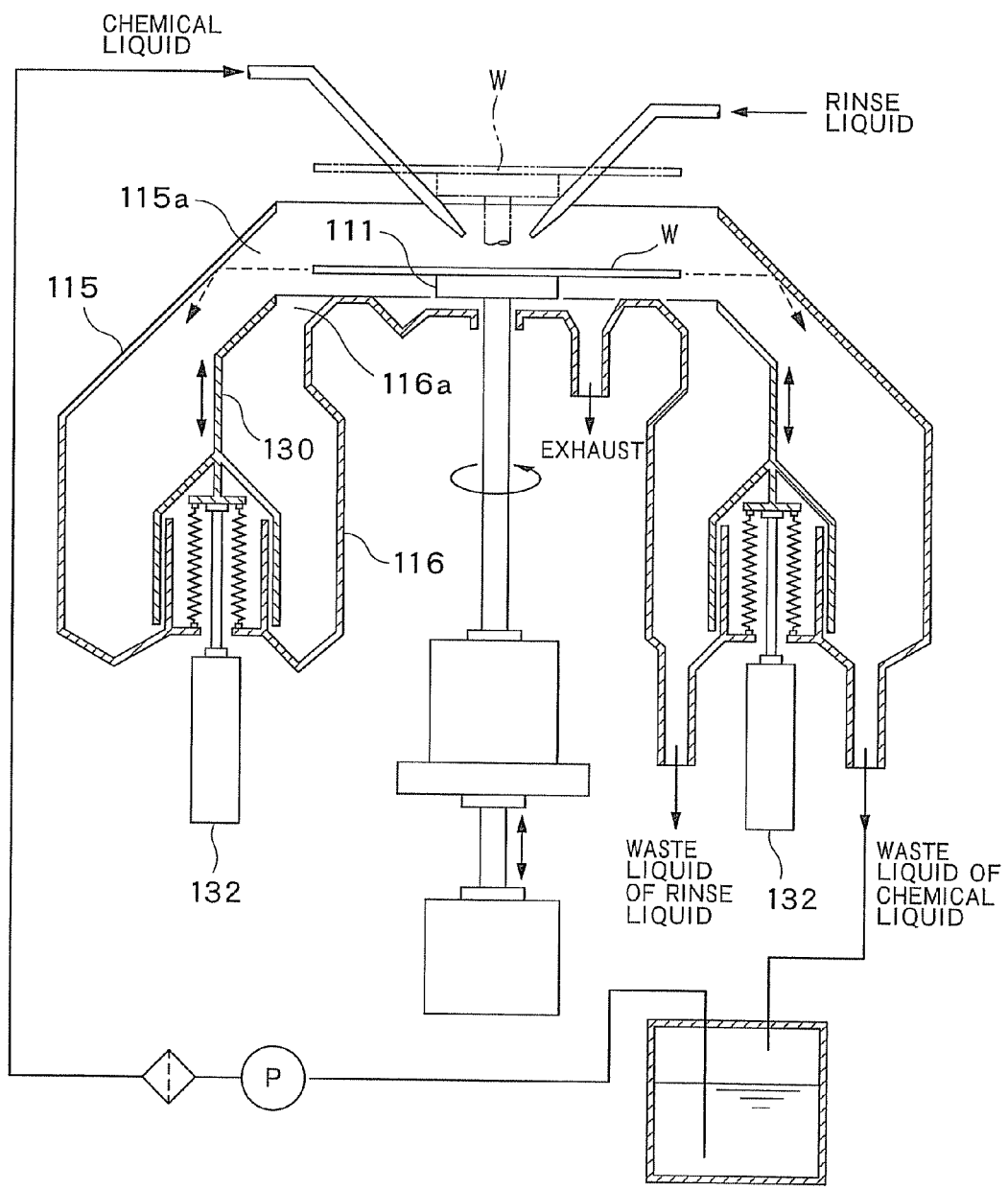
FIG. 7 is a cross-sectional view schematically illustrating an existing liquid processing apparatus.

Next, each of the first to third recovery states will be specifically described by referring to FIGS. 4 to 6. First, the first recovery state of FIG. 1 will be specifically described by referring to FIG. 4. In the first recovery state, as shown in FIG. 4, the outer flange 21a of the upper liquid guide cup 21 is supported by the support protrusion 29s so that the edge of the upper liquid guide cup 21 that is near the mist guide cup 15 is located above the peripheral edge area of the mist guide cup 15, and the edge of the central liquid guide cup 22 that is near the mist guide cup 15 and the edge of the lower liquid guide cup 23 that is near the mist guide cup 15 are located below the peripheral edge area of the mist guide cup 15. Accordingly, a liquid (and the mist thereof) is recovered via a gap between the upper liquid guide cup 21 and the central liquid guide cup 22.

Specifically, the liquid (and the mist thereof) passes a gap between the sloped portion of the upper liquid guide cup 21 and the sloped portion of the central liquid guide cup 22 and further passes the outer peripheral area of the vertical portion of the central liquid guide cup 22, so that the liquid reaches the first drain tank 31. In order to ensure the channel of the liquid (and the mist thereof) at the outer peripheral area of the vertical portion of the central liquid guide cup 22, the vertical portion of the central liquid guide cup 22 and the outer peripheral contact portion 22a are connected at several portions at a predetermined interval in the circumferential direction.

Further, in the first recovery state, as described above, the central liquid guide cup 22 is positioned at the lowest position by the up-down movement cylinder 25. Therefore, so as not to interfere with the central liquid guide cup 22 located at the low position, the height at the inner periphery of the first drain tank 31 is set to be low.

Further, in the first recovery state, as described above, the lower liquid guide cup 23 is supported by the support protrusion 28s provided to the member 28 fixed to the substrate process chamber 11 from the underside thereof. Then, the gap between the central liquid guide cup 22 and the lower liquid guide cup 23 is blocked. In this case, the sloped portion of the central liquid guide cup 22 overlaps the sloped portion of the lower liquid guide cup 23, that is, the gap between the central liquid guide cup 22 and the lower liquid guide cup 23 becomes minimal. Accordingly, the space for the vertical movement of each of the cups 21, 22, and 23 is reduced compared to the configuration in which the gap between the central liquid guide cup 22 and the lower liquid guide cup 23 is constant in each of the recovery states. For this reason, the vertical portion of the lower liquid guide cup 23 is prevented from interfering with the drain tank provided at the lower area, suppressing an increase in the entire height of the liquid processing apparatus 10.

Furthermore, in this state, the positioning of the central liquid guide cup 22 may be achieved in a manner such that the sloped portion thereof is supported by the sloped portion of the lower liquid guide cup 23 under the force of gravity, or in a manner of controlling the up-down movement cylinder 25 by the control unit 41.

Next, the second recovery state of FIG. 2 will be specifically described by referring to FIG. 5. In the second recovery state, the edge of the central liquid guide cup 22 that is near the mist guide cup 15 is located above the peripheral edge area of the mist guide cup 15, and the edge of the lower liquid guide cup 23 that is near the mist guide cup 15 is positioned below the peripheral edge area of the mist guide cup 15. Accordingly, a liquid (and mist thereof) is recovered via the gap between the central liquid guide cup 22 and the lower liquid guide cup 23.

Specifically, the liquid (and the mist thereof) passes through the gap between the sloped portion of the central liquid guide cup 22 and the sloped portion of the lower liquid guide cup 23 and further passes the outer peripheral area of the vertical portion of the lower liquid guide cup 23, so that it reaches the second drain tank 32. Since the outer flange 23b is provided at the outer peripheral area of the vertical portion of the lower liquid guide cup 23, liquefaction of mist is promoted. Here, although the inner peripheral contact portion 22b of the central liquid guide cup 22 is formed as an annular portion protruding toward the inner periphery, liquefaction of mist is further promoted due to the presence of the inner peripheral contact portion 22b.

In the second recovery state, as shown in FIG. 5, the outer flange 21a of the upper liquid guide cup 21 is pushed upward by the outer peripheral contact portion 22a of the central liquid guide cup 22, and the upper liquid guide cup 21 is supported by the central liquid guide cup 22. Then, the gap between the central liquid guide cup 22 and the upper liquid guide cup 21 is blocked. In this case, the sloped portion of the central liquid guide cup 22 overlaps the sloped portion of the upper liquid guide cup 21, that is, the gap between the central liquid guide cup 22 and the upper liquid guide cup 21 becomes minimal. Accordingly, the space for the vertical movement of each of the cups 21, 22, and 23 is reduced compared to the configuration in which the gap between the upper liquid guide cup 21 and the central liquid guide cup 22 is constant in each of the recovery states.

In this state, the central liquid guide cup 22 is positioned by the control of the up-down movement cylinder 25 using the control unit 41. Furthermore, the position of the lower liquid guide cup 23 is the same as that of the first recovery state.

Next, the third recovery state of FIG. 3 will be specifically described by referring to FIG. 6. In the third recovery state, the edge of the lower liquid guide cup 23 that is near the mist guide cup 15 is also located above the peripheral edge area of the mist guide cup 15. Accordingly, a liquid (and mist thereof) is recovered via the lower side of the lower liquid guide cup 23.

Specifically, the liquid (and the mist thereof) passes the lower side of the sloped portion of the lower liquid guide cup 23 and further passes the inner peripheral area of the vertical portion of the lower liquid guide cup 23, so that it reaches the third drain tank 33. As shown in FIG. 6, when an annular portion is provided at the lower end of the vertical portion of the lower liquid guide cup 23 so as to protrude toward the inner periphery, liquefaction of mist is promoted by the annular portion.

In the third recovery state, as shown in FIG. 6, the outer flange 21a of the upper liquid guide cup 21 is pushed upward by the outer peripheral contact portion 22a of the central liquid guide cup 22 up to a position higher than that of the second recovery state, so that the upper liquid guide cup 21 is supported by the central liquid guide cup 22. Then, the gap between the central liquid guide cup 22 and the upper liquid guide cup 21 is blocked. In this case, the sloped portion of the central liquid guide cup 22 overlaps with the sloped portion of the upper liquid guide cup 21, that is, the gap between the central liquid guide cup 22 and the upper liquid guide cup 21 becomes minimal. Accordingly, the space for the vertical movement of each of the cups 21, 22, and 23 is reduced compared to the configuration in which the gap between the upper liquid guide cup 21 and the central liquid guide cup 22 is constant in each of the recovery states.

Furthermore, in the third recovery state, as shown in FIG. 6, the outer flange 23b of the lower liquid guide cup 23 is pushed upward by the inner peripheral contact portion 22b of the central liquid guide cup 22 up to a position higher than that of the second recovery state, so that the lower liquid guide cup 23 is supported by the central liquid guide cup 22. At this time, although the gap between the sloped portion of the central liquid guide cup 22 and the sloped portion of the lower liquid guide cup 23 is larger than that of the second recovery state (FIG. 5), the effect obtained by minimizing the gap between the central liquid guide cup 22 and the upper liquid guide cup 21 is large. For this reason, the space for the vertical movement of each of the cups 21, 22, and 23 is reduced as a whole.

In this state, the central liquid guide cup 22 is positioned by the control of the up-down movement cylinder 25 using the control unit 41.

In the actual liquid process, it is desirable that the organic liquid is recovered in the first drain tank 31, the acidic liquid is recovered in the second drain tank 32, and the alkaline liquid is recovered in the third drain tank 33. The fourth drain tank 34 may be used to recover the mixture of various liquids, for example, when the placement table 12 rotates at a low speed.

According to the embodiment with the above-described configuration, when the organic liquid is supplied to the substrate, the organic liquid scattering from the substrate may be guided by the upper liquid guide cup 21 to be recovered in the first drain tank 31. In the same manner, when the acidic liquid is supplied to the substrate, the acidic liquid scattering from the substrate may be guided by the central liquid guide cup 22 to be recovered in the second drain tank 32. Also, when the alkaline liquid is supplied to the substrate, the scattering alkaline liquid may be guided by the lower liquid guide cup 23 to be recovered in the third drain tank 33. That is, the liquid scattering from the substrate may be guided to the corresponding cup by appropriately moving up and down the upper liquid guide cup 21, the central liquid guide cup 22, and the lower liquid guide cup 23 in accordance with the type of the liquid supplied to the substrate. Accordingly, the mist of three types or more of process-liquids may be separately recovered with high efficiency.

Further, the central liquid guide cup 22 and the lower liquid guide cup 23 are blocked in the first recovery state, and the upper liquid guide cup 21 and the central liquid guide cup 22 are blocked in the second recovery state and the third recovery state. Accordingly, the space for the vertical moving of each of the cups 21, 22, and 23 is reduced compared to the configuration in which the gap between the upper liquid guide cup 21 and the central liquid guide cup 22 and the gap between the central liquid guide cup 22 and the lower liquid guide cup 23 are constant in each of the recovery states. Further, tanks 31 to 34 are provided at the lower area of the upper liquid guide cup 21, the central liquid guide cup 22, and the lower liquid guide cup 23 to recover the liquid guided by the corresponding cup and temporarily store the liquid therein. By adopting such an arrangement relationship, the liquid once liquefied may be suppressed from becoming mist again. Further, since the tanks 31 to 34 are arranged in series in the radial direction, a liquid guide drain pipe may be easily connected to each of the tanks 31 to 34. Furthermore, a path for releasing a gas throwing off from the substrate may be easily designed.

Further, as described above, the inner peripheral side partition wall of the first drain tank 31, that is, the height of the partition wall between the first drain tank 31 and the second drain tank 32 is set to be lower than the height of the partition wall between the second drain tank 32 and the third drain tank 33. Accordingly, the partition wall between the first drain tank 31 and the second drain tank 32 may be prevented from interfering with the central liquid guide cup 22, and a degree of freedom in design of each cup structure can be improved.

Furthermore, in the embodiment, the gap between the central liquid guide cup 22 and the lower liquid guide cup 23 in the third recovery state is set to be longer than that of the second recovery state. However, not limited thereto, the gap between the central liquid guide cup 22 and the lower liquid guide cup 23 in the third recovery state may be set to be shorter than that of the second recovery state. Even in this case, the same effect as that of the above-described embodiment may be substantially obtained.

Incidentally, in the description above, an example has been described in which the substrate liquid processing apparatus, the method of controlling the substrate liquid processing apparatus, and the storage medium performing the substrate liquid processing apparatus control method on the substrate liquid processing apparatus are applied to the cleaning process of the semiconductor wafer W. However, the present invention is not limited thereto and may be also applied to cleaning processes of various substrates such as an LCD substrate or a CD substrate.

The invention claimed is:
1. A substrate liquid processing apparatus comprising:
a placement table configured to hold a substrate;
a rotary driving unit configured to rotate the placement table;
a liquid supply unit configured to supply a liquid to the substrate placed on the placement table;
an outer upper liquid guide cup, a central liquid guide cup, and an inner lower liquid guide cup which are disposed in this order from the top and are configured to guide downward the liquid scattering from the rotating substrate being placed on the placement table; and
a driving mechanism configured to move up and down the upper liquid guide cup, the central liquid guide cup, and the lower liquid guide cup,
wherein the driving mechanism is connected to the central liquid guide cup and the upper liquid guide cup is moved upward in a manner of being supported by the central liquid guide cup, and
wherein while the driving mechanism moves upward the central liquid guide cup, the central liquid guide cup moves upward independently and spaced apart from the upper liquid guide cup and the lower liquid guide cup in a partial range of an upward movement range and moves upward together with the upper liquid guide cup supported by the central liquid guide cup in another partial range of the upward movement range.
2. The substrate liquid processing apparatus according to claim 1, wherein the upper liquid guide cup includes an outer flange provided at the outer peripheral wall thereof, the central liquid guide cup includes an outer peripheral contact portion capable of supporting the outer flange of the upper liquid guide cup from the lower side, and when the central liquid guide cup moves upward in the state where the outer peripheral contact portion of the central liquid guide cup supports the outer flange of the upper liquid guide cup from the lower side, the upper liquid guide cup moves upward simultaneously.

3. A substrate liquid processing apparatus comprising:
a placement table configured to hold a substrate;
a rotary driving unit configured to rotate the placement table;
a liquid supply unit configured to supply a liquid to the substrate placed on the placement table;
an outer upper liquid guide cup, a central liquid guide cup, and an inner lower liquid guide cup which are disposed in this order from the top and are configured to guide downward the liquid scattering from the rotating substrate being placed on the placement table; and
a driving mechanism configured to move up and down the upper liquid guide cup, the central liquid guide cup, and the lower liquid guide cup,
wherein the driving mechanism is connected to the central liquid guide cup and the lower liquid guide cup is moved upward in a manner of being supported by the central liquid guide cup, and
wherein while the driving mechanism moves upward the central liquid guide cup, the central liquid guide cup moves upward independently and spaced apart from the upper liquid guide cup and the lower liquid guide cup in a partial range of an upward movement range and moves upward together with the lower liquid guide cup supported by the central liquid guide cup in another partial range of the upward movement range.

4. The substrate liquid processing apparatus according to claim 3,
wherein the lower liquid guide cup includes an outer flange provided at the outer peripheral wall thereof,
the central liquid guide cup includes an inner peripheral contact portion capable of supporting the outer flange of the lower liquid guide cup from the lower side, and
when the central liquid guide cup moves upward in the state where the inner peripheral contact portion of the central liquid guide cup supports the outer flange of the lower liquid guide cup from the lower side, the lower liquid guide cup moves upward simultaneously.

5. The substrate liquid processing apparatus according to claim 1,
wherein each of the upper liquid guide cup and the lower liquid guide cup is configured to be individually supported by the central liquid guide cup.

6. The substrate liquid processing apparatus according to claim 5,
wherein while the driving mechanism moves upward the central liquid guide cup, the central liquid guide cup moves upward together with the upper liquid guide cup and the lower liquid guide cup which are individually supported by the central liquid guide cup in another further partial range of the upward movement range.

7. The substrate liquid processing apparatus according to claim 5,
wherein the upper liquid guide cup includes an outer flange provided at the outer peripheral wall thereof,
the lower liquid guide cup includes an outer flange provided at the outer peripheral wall thereof,
the central liquid guide cup includes an outer peripheral contact portion capable of supporting the outer flange of the upper liquid guide cup from the lower side and an inner peripheral contact portion capable of supporting the outer flange of the lower liquid guide cup from the lower side, and
when the central liquid guide cup moves upward in the state where the outer peripheral contact portion of the central liquid guide cup supports the outer flange of the upper liquid guide cup from the lower side and the inner peripheral contact portion of the central liquid guide cup supports the outer flange of the lower liquid guide cup from the lower side, the upper liquid guide cup and the lower liquid guide cup move upward simultaneously.

8. The substrate liquid processing apparatus according to claim 1,
wherein when the liquid scattering from the rotating substrate being placed on the placement table is guided to a gap between the upper liquid guide cup and the central liquid guide cup, a gap between the central liquid guide cup and the lower liquid guide cup is blocked.

9. The substrate liquid processing apparatus according to claim 1,
wherein when the liquid scattering from the rotating substrate being placed on the placement table is guided to a gap between the central liquid guide cup and the lower liquid guide cup, a gap between the upper liquid guide cup and the central liquid guide cup is blocked.

10. The substrate liquid processing apparatus according to claim 6,
wherein when the upper liquid guide cup and the lower liquid guide cup are individually supported by the central liquid guide cup, a gap between the upper liquid guide cup and the central liquid guide cup is blocked.

11. The substrate liquid processing apparatus according to claim 6,
wherein the partial range in which the central liquid guide cup moves upward independently is positioned below the partial range in which the central liquid guide cup moves upward together with the upper liquid guide cup and lower liquid guide cup,
wherein when the central liquid guide cup is positioned at the lowest position, a gap between the central liquid guide cup and the lower liquid guide cup is blocked.

* * * * *